United States Patent
Pfeiffer et al.

(10) Patent No.: US 8,831,062 B2
(45) Date of Patent: Sep. 9, 2014

(54) SEMICONDUCTOR LASER DIODES

(75) Inventors: Hans-Ulrich Pfeiffer, Zürich (CH); Andrew Cannon Carter, Blisworth (GB); Jörg Troger, Raron (CH); Norbert Lichtenstein, Langnau Am Albis (CH); Michael Schwarz, Altendorf (CH); Abram Jakubowicz, Pfäffikon (CH); Boris Sverdlov, Adliswil (CH)

(73) Assignee: II-VI Laser Enterprise GmbH, Zurich (CH)

(*) Notice: Subject to any disclaimer, the term of this patent is extended or adjusted under 35 U.S.C. 154(b) by 81 days.

(21) Appl. No.: 13/639,833

(22) PCT Filed: Apr. 6, 2011

(86) PCT No.: PCT/GB2011/050680
§ 371 (c)(1),
(2), (4) Date: Nov. 30, 2012

(87) PCT Pub. No.: WO2011/124914
PCT Pub. Date: Oct. 13, 2011

(65) Prior Publication Data
US 2013/0070800 A1    Mar. 21, 2013

(30) Foreign Application Priority Data
Apr. 6, 2010  (GB) .................................. 1005696.8

(51) Int. Cl.
*H01S 5/00*    (2006.01)
*H01S 5/042*   (2006.01)
*H01S 5/22*    (2006.01)
*H01S 5/20*    (2006.01)
*H01S 5/10*    (2006.01)
*H01S 5/16*    (2006.01)

(52) U.S. Cl.
CPC ................. *H01S 5/0425* (2013.01); *H01S 5/22* (2013.01); *H01S 5/0014* (2013.01); *H01S 5/2004* (2013.01); *H01S 5/1039* (2013.01); *H01S 5/16* (2013.01); *H01S 5/1053* (2013.01); *H01S 5/1064* (2013.01)
USPC ................. 372/46.01; 372/43.01; 372/44.01; 372/87; 372/38.05; 372/38.07; 372/75; 438/34; 438/35; 438/39; 438/47; 257/94; 257/95; 257/96; 257/97; 257/98; 257/E33.062; 257/E33.063; 257/E33.065

(58) Field of Classification Search
CPC . H01S 5/0425; H01S 2301/18; H01S 5/2231; H01S 2301/176; H01S 5/02276; H01S 3/038; H01S 5/3095; H01S 3/0385; H01S 5/0602; H01S 5/06226; H01S 5/34; H01S 3/10; H01S 5/06255; H01S 5/22; H01S 5/1064; H01S 5/2004; H01S 5/1053; H01S 5/1039; H01S 5/16; H01S 5/0014
USPC ......... 372/43.01, 44.01, 46.01, 87, 38.05, 75, 372/38.07; 257/94–98, E33.062, E33.063, 257/E33.065; 438/34, 35, 39, 47
See application file for complete search history.

(56) References Cited

U.S. PATENT DOCUMENTS

| | | | | |
|---|---|---|---|---|
| 3,551,842 A * | 12/1970 | Nelson | ........................ | 372/46.01 |
| 5,014,280 A * | 5/1991 | Sanada et al. | ............... | 372/45.01 |
| 5,684,816 A * | 11/1997 | Takagi | ........................ | 372/44.01 |
| 5,835,261 A | 11/1998 | Tamanuki et al. | | |
| 6,349,104 B1 * | 2/2002 | Kato et al. | ........................ | 372/36 |
| 2002/0015429 A1 | 2/2002 | Kimura | | |
| 2002/0024985 A1 | 2/2002 | Takeuchi et al. | | |
| 2002/0113279 A1 | 8/2002 | Hanamaki et al. | | |
| 2002/0159492 A1 | 10/2002 | Yamamura et al. | | |
| 2003/0112842 A1 | 6/2003 | Crawford | | |
| 2003/0151059 A1 | 8/2003 | Wakisaka et al. | | |
| 2007/0131960 A1 | 6/2007 | Ohmi et al. | | |
| 2008/0192787 A1 | 8/2008 | Yamamoto et al. | | |
| 2010/0189152 A1* | 7/2010 | Harder et al. | ............... | 372/46.01 |

FOREIGN PATENT DOCUMENTS

| | | |
|---|---|---|
| EP | 1710877 B1 | 12/2010 |
| GB | 2283858 A | 5/1995 |
| GB | 2427752 A | 1/2007 |
| JP | 2278781 A | 11/1990 |
| JP | 2001-358405 A | 12/2001 |
| JP | 2002-076502 | 3/2002 |

| JP | 2002-261379 | 9/2002 |
| JP | 2003-008145 A | 1/2003 |
| JP | 2008-544561 | 12/2008 |
| WO | 2007000615 A3 | 6/2007 |

OTHER PUBLICATIONS

Harder et al. WO 2007/000615 (English translation); Jan. 4, 2007; pp. 1-38.*
Patent Cooperation Treaty, Written Opinion of the International Searching Authority, International Patent Application No. PCT/GB2011/050680, mailed Aug. 1, 2011, 7 pages.
PCT International Search Report dated Aug. 1, 2011, for International Application No. PCT/GB2011/050680, 4 pages.
GB Search Report dated Aug. 4, 2010, for GB Application No. GB1005696.8, 2 pages.
Office Action for Japanese Patent Application No. JP 2013-503173, May 12, 2014, 6 Pages.

* cited by examiner

*Primary Examiner* — Julio J Maldonado
*Assistant Examiner* — Delma R Forde
(74) *Attorney, Agent, or Firm* — Fenwick & West LLP

(57) ABSTRACT

A semiconductor laser diode comprises a semiconductor body having an n-region and a p-region laterally spaced apart within the semiconductor body. The laser diode is provided with an active region between the n-region and the p-region having a front end and a back end section, an n-metallization layer located adjacent the n-region and having a first injector for injecting current into the active region, and a p-metallization layer opposite to the n-metallization layer and adjacent the p-region and having a second injector for injecting current into the active region. The thickness and/or width of at least one metallization layer is chosen so as to control the current injection in a part of the active region near at least one end of the active region compared to the current injection in another part of the active region. The width of the at least one metallization layer is larger than a width of the active region. This arrangement results in substantially uniform current distribution near the front end of the active region. Advantageously, this uniform current density significantly improves the reliability of the laser diode.

16 Claims, 9 Drawing Sheets

Fig. 1 — PRIOR ART

SEMICONDUCTOR LASER DIODES

BACKGROUND OF THE INVENTION

The present invention relates to semiconductor laser diodes, and particularly to high power laser diodes.

High power laser diodes are important components in the technology of optical communication, particularly because such laser diodes can be used for fiber pumping and other high power laser diode applications. This allows all-optical fibre communication systems to be designed, avoiding any complicated conversion of the signals to be transmitted, which improves speed as well as the reliability of such systems. Other uses of such high power laser diodes include cable TV (CATV) amplifiers, printing applications, and medical applications.

A schematic representation of a typical semiconductor laser diode 100 is shown in FIG. 1, and consists of a (strained) quantum well active region 103 sandwiched between two semiconductor (AlGaAs) cladding layers 104, 105. A first cladding layer 104, which is grown first on a substrate, is commonly referred to as a lower cladding layer, and is typically n-type doped. A second cladding layer 105, which is grown second on the substrate, after growth of the active region 103, is commonly referred to as an upper cladding layer, and is typically p-type doped. The laser diode 100 includes two electrodes 101, 102. A first electrode metallization layer (n-metallisation layer) 101 provides electrical contact to the first cladding layer 104, and a second electrode metallization layer (p-metallisation layer) 102 provides electrical contact to the second cladding layer 105.

It has been demonstrated that defects generated during operation, often at the output end (usually known as the front end or front facet) 106 of the laser diode 100, are responsible for the failure of the laser diode. This is believed to be due to an inherent non-uniform current density distribution along a laser cavity, with the highest current flowing towards the front end of the laser diode. Non-uniform photon density distribution within the laser cavity is responsible for this non-uniform current density. FIG. 2 illustrates photon density distribution 200, 201, 202 for some high-power laser diodes. This ideal case can exist if the series resistance of the laser diode is zero. In this case the current distribution should be in line with the photon density distribution. It can therefore be understood from FIG. 2 that the current density towards the front end of the laser diode could be as much as 20 times higher than towards the back end.

Such high current density can result in local overheating of the laser diode, which is also responsible for the predominant defect formation at the front end. This local heating has a secondary adverse effect on reliability.

It has been further demonstrated that finite internal resistance of the laser diode 100 may mitigate to some extent the effect of the current non-uniformity. Distributed series resistance is normally formed within the p-cladding layer 105 of the laser diode 100. The voltage drop due to the series resistance provides a negative feedback for the current distribution along an axis of the laser diode 100. However, increasing the series resistance of the laser diode affects some operational characteristics. For example, this affects negatively the conversion efficiency. In addition, increasing internal series resistance, i.e. by lowering the carrier concentration in the layers of the laser diode 100, increases heat generation within low thermal conductivity materials of the laser diode.

WO 2007/000615 discloses a high power laser diode in which current injection towards the front end of the diode is reduced by using different types of electrical connection attached to the metallisation layer. The electrical connections are shaped or constructed by "wire-bonding". The location of the wire bonded electrical connections is chosen so as to reduce the current injection at the front end of the device.

Various other wire-bonding configurations have been tried, but modifying wire-bonding configuration on its own has been found inadequate to provide uniform current distribution. Other techniques such as submount profiling have also been tried, but proved too weak to fully compensate the longitudinal non-uniformity of the current distribution.

Thus, there is a need for another way of producing uniform current distribution towards the front end of the laser diode in order to improve reliability.

SUMMARY OF THE INVENTION

It is an object of the present invention to provide a simple design for such a laser diode in order to provide uniform current distribution.

According to one aspect of the invention there is provided a semiconductor laser diode comprising a semiconductor body having a n-region and a p-region laterally spaced apart within the semiconductor body; an active region between the n-region and the p-region having a front end and a back end. The laser diode further comprises a first metallisation layer adjacent the n-region and having a first injector disposed thereon for injecting current into the active region; and a second metallisation layer opposite the first metallisation layer and adjacent the p-region and having a second injector disposed thereon for injecting current into the active region. The thickness and/or width of at least one metallisation layer is chosen so as to control the current injection in a part of the active region near at least one end of the active region compared to the current injection in another part of the active region, and the width of the at least one metallisation layer is larger than the width of the active region.

The at least one metallisation layer may comprise a front end section near the front end of the active region, and the front end section is configured such that the current injection near the front end of the active region is substantially reduced compared to that elsewhere in the active region. The width and/or the thickness of the front end section of the at least one metallisation layer may be less than that elsewhere in the metallisation layer.

The front end section of the at least one metallisation layer may be configured such that the resistance of the at least one metallisation layer is increased in the front end section compared to elsewhere in the metallisation layer. The at least one metallisation layer may be configured to provide a substantially uniform current density near the front end of the active region. The at least one metallisation layer may be configured such that the current injection near the front and back ends of the active region is reduced compared to that in a middle section of the active region.

The active region may comprise a flared portion near the front end, which is covered by a section of the at least one metallisation layer having reduced width and/or thickness. The injector may comprise a wire bond placed on a section of the at least one metallization layer distant from the at least one end of the active region.

The laser diode may further comprise an insulating layer at the front end of the active region between at least one metallization layer and the semiconductor body for blocking current injection at the front end of the active region. The insulating layer may form an unpumped end section in the active region.

The at least one metallisation layer may comprise a first layer and a second layer, the second layer being thicker than the first layer. The second layer may cover at least part of the first layer over a back end section of the at least one metallization layer. The width and/or thickness of the front end section of the at least one metallisation layer may be reduced by providing insulating gaps in the at least one metallisation layer.

The substantially reduced current injection near the front end of the active region may be produced by submount profiling or material optimisation of the p-region and/or n-region or material optimisation of the at least one metallisation layer.

The laser diode may be selected from the group comprising a flared ridge diode, a non-flared ridge diode, and a broad area single emitter (BASE) diode.

The p-region of the semiconductor body may be configured to be bonded to a metallised submount. The laser diode may have left-right symmetry to maintain a thermal waveguide balance.

According to another aspect of the invention, there is provided a method of manufacturing a high power laser diode comprising: a semiconductor body having a n-region and a p-region laterally spaced apart within the semiconductor body; an active region between the n-region and the p-region having a front end and a back end; a first metallisation layer adjacent the n-region and having a first injector disposed thereon for injecting current into the active region; and a second metallisation layer opposite the first metallisation layer and adjacent the p-region and having a second injector disposed thereon for injecting current into the active region. The method comprises varying the width and/or thickness of at least one metallisation layer along the length of the diode so as to control the current injection in a part of the active region near at least one end of the active region compared to the current injection in another part of the active region, the width of the at least one metallisation layer being greater than the width of the active region along the length of the diode.

The method may comprise manufacturing the at least one metallisation layer by a patterning process selected from the group comprising selective deposition and selective removal after deposition or etching. The method may further comprise choosing a shape of a mask used for the patterning process so as to achieve a predetermined pattern of the metallisation layer.

BRIEF DESCRIPTION OF THE DRAWINGS

In order that the invention may be more fully understood, a number of embodiments of the invention will now be described, by way of example, with reference to the accompanying drawings, in which.

DETAILED DESCRIPTION OF THE DRAWINGS

The present inventors have appreciated that increasing resistance deliberately within high power laser diodes could have an adverse effect, as this would increase heating, forward voltage and dissipation. All of these could result in poorer electro-optic performance and reliability. However, when extreme performance and reliability are required, the advantages of ensuring a uniform current density greatly outweigh any disadvantages due to dissipation. As the reliability of the laser diode tends to be determined by the 'weakest' point in the diode, keeping current density low and uniform is advantageous. As the failure rate of the weakest region is approximately in an exponential relationship with the current density ($J^{3-6}$), it is particularly advantageous to control this. For example, if the excess current density in the weakest region of the device is 15%, then for $J^5$ the failure rate is doubled. Advantageously, the patterning or profiling of the second metallisation layer of the present invention is capable of achieving the necessary uniformity in current distribution.

Figure 1:
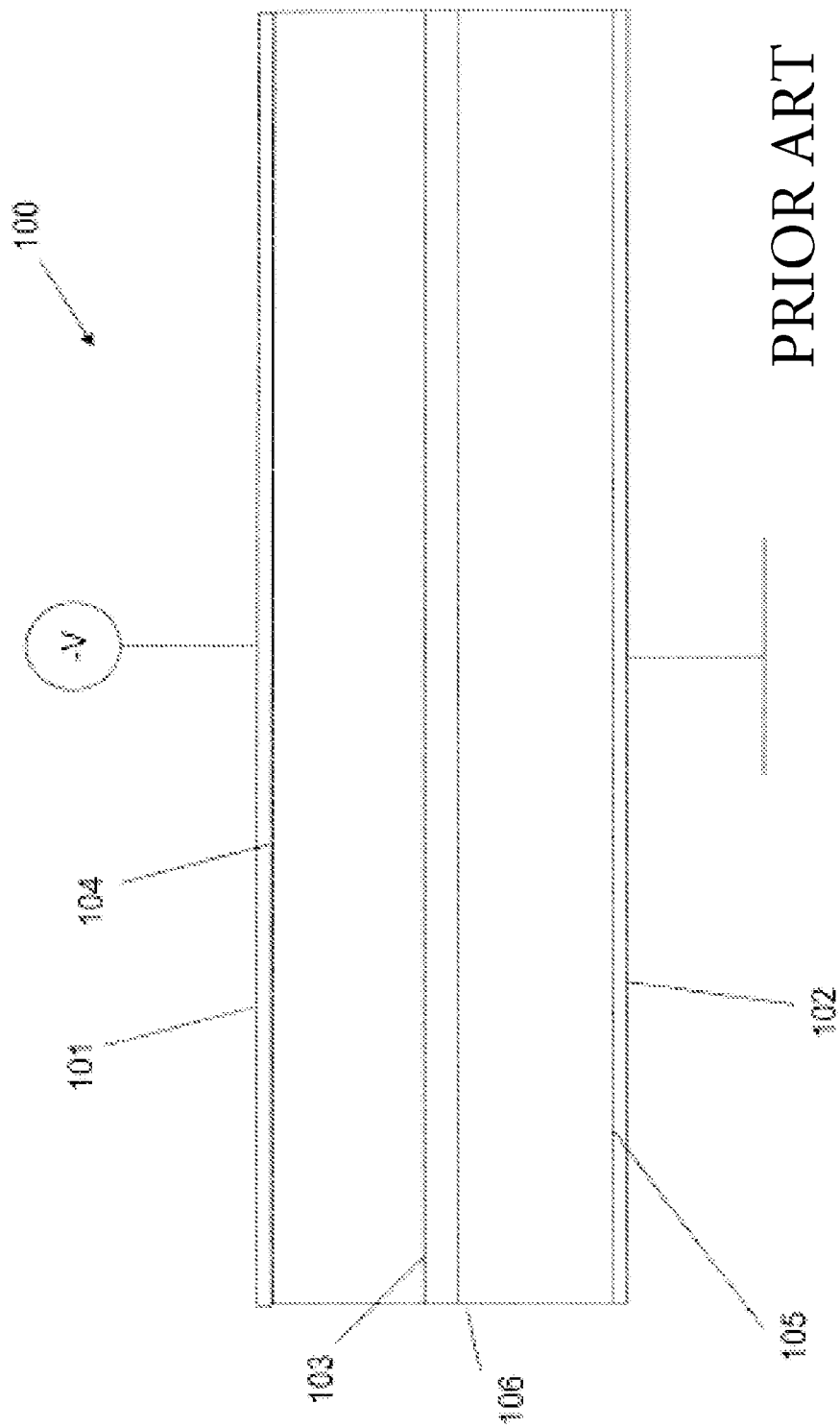
FIG. 1 is a schematic cross-section through a high power laser diode.
Figure 2:
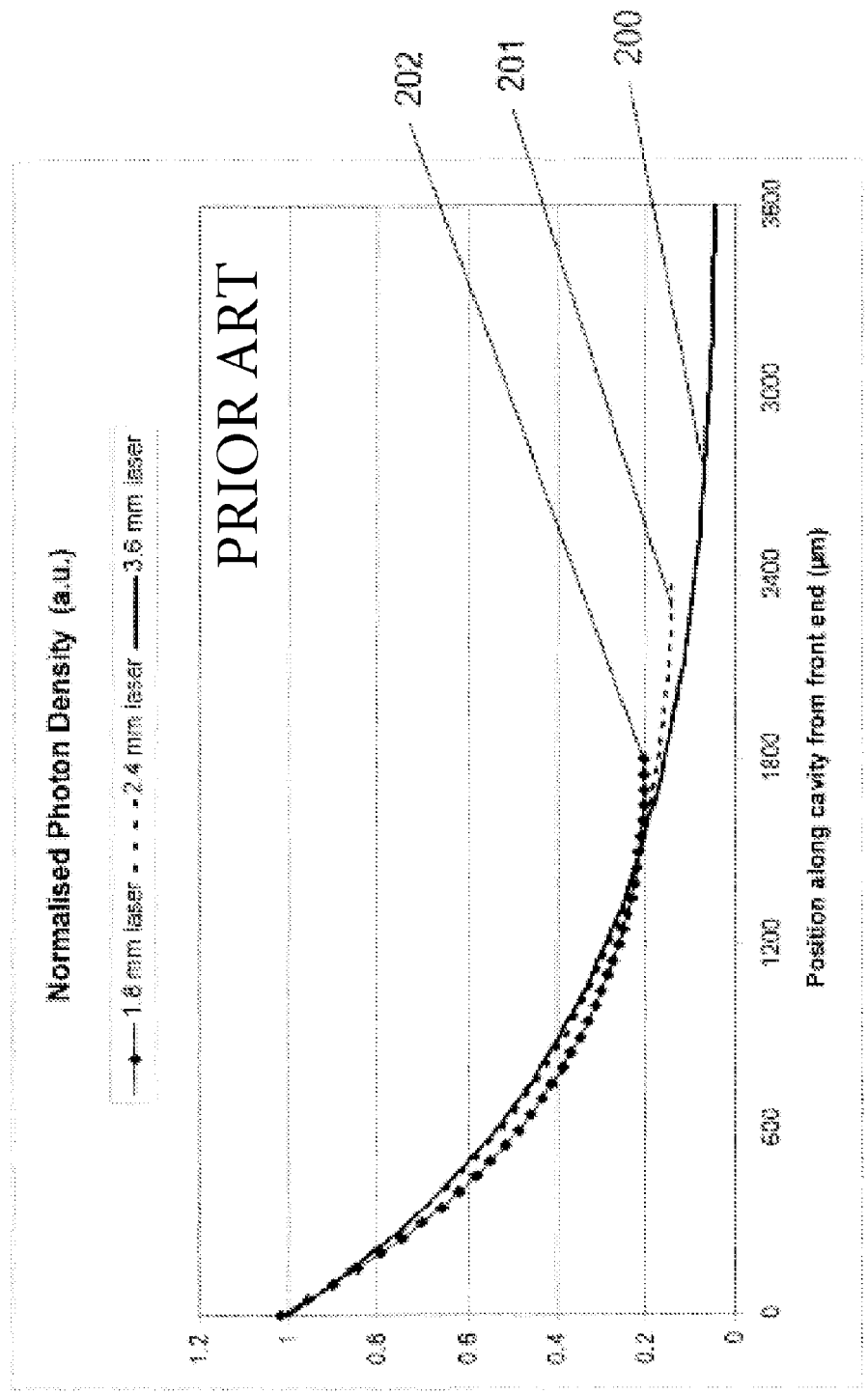
FIG. 2 shows ideal photon density for some high power laser diodes.
Figure 3:
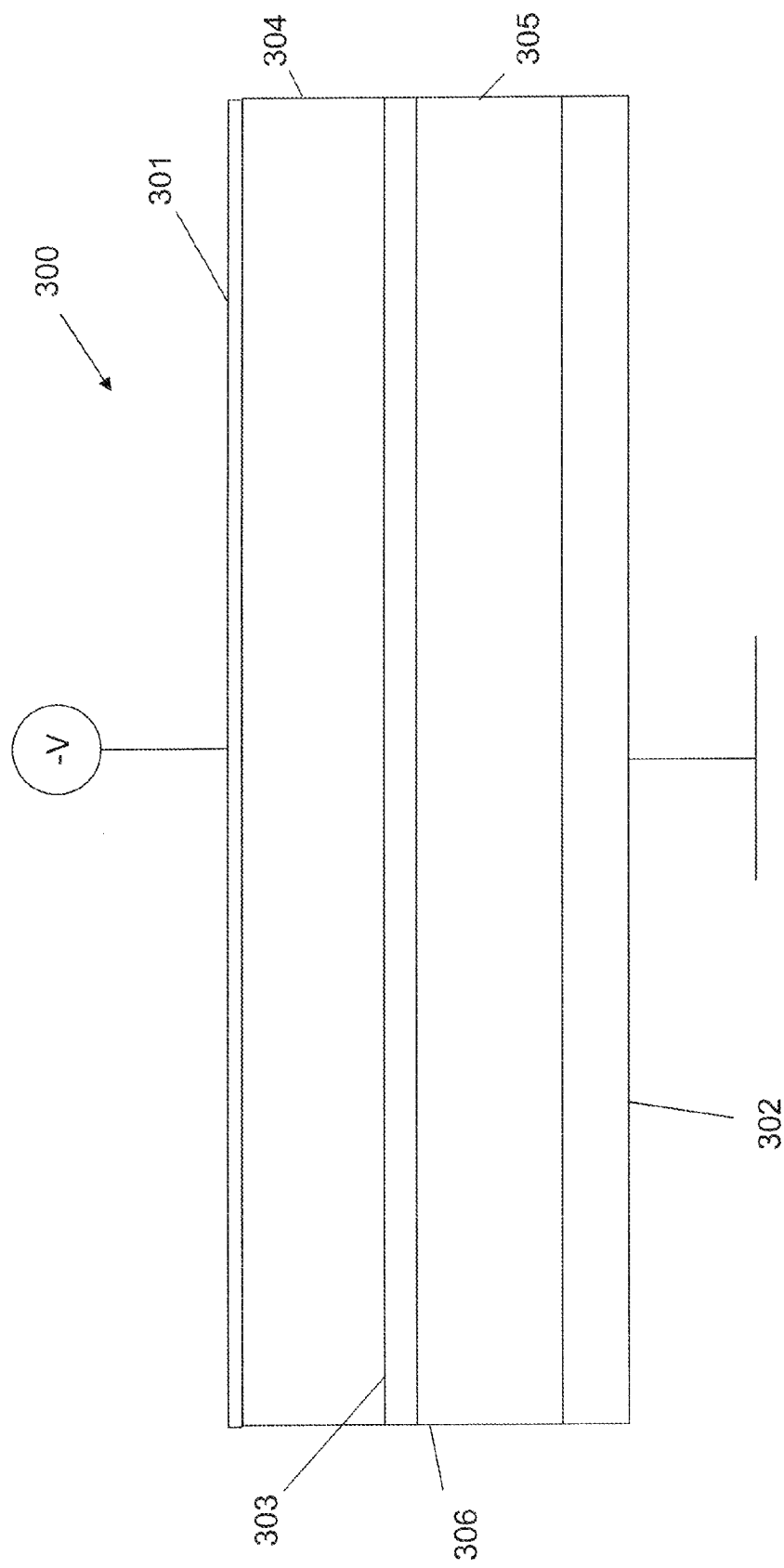
FIG. 3 is a schematic cross-section through a laser diode with a modified metallisation layer resistance.

FIG. 3 is a schematic cross-section through a high power laser diode 300 including a p-semiconductor cladding layer 305, an n-semiconductor cladding layer 304, an active region 303 sandwiched between the semiconductor layers 304, 305, an n-metallisation layer 301 connected to the n-semiconductor layer 304 and p-metallisation layer 302 connected to the p-semiconductor layer 305. The p-metallisation layer 302 is shaped such that there is additional resistance formed in the p-metallisation layer 302 compared to the n-metallisation layer 304. A voltage to the p-semiconductor layer 305 is applied along a laser diode axis through the p-metallisation layer 302 with some finite resistivity. When such a voltage is applied, an additional voltage drop occurs in the p-metallisation layer 302 to result in a lower voltage near a front end 306 of the laser diode 300. It will be appreciated that the resistance of the p-metallisation layer 302 can be controlled by varying the width and/or the thickness of the p-metallisation layer 302, as will be discussed with reference to FIGS. 4a to 4d. The design of the p-metallisation layer can be varied in order to achieve uniform current distribution near the front end of the laser diode.

Figure 4A:
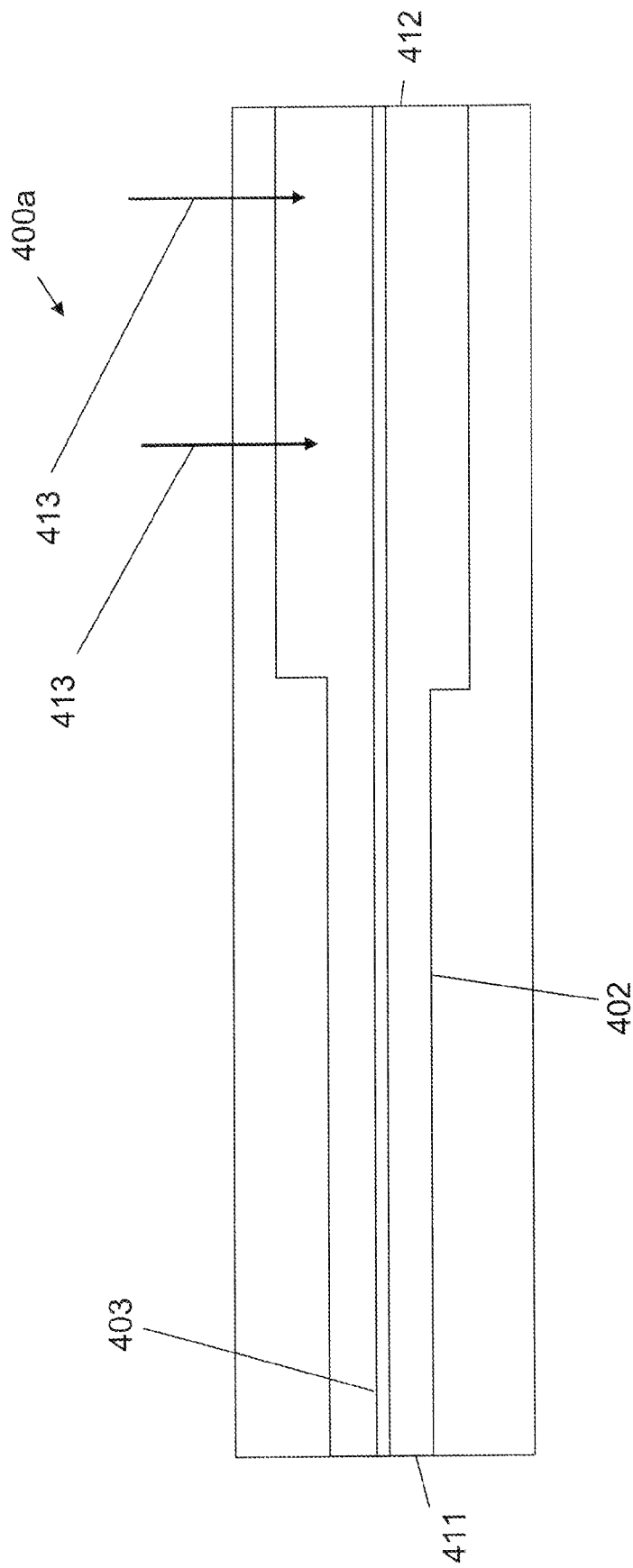
FIGS. 4a to 4d are schematic plan views of laser diodes of the type shown in FIG. 3.

FIG. 4a is a schematic plan view (not to scale) of a high power laser diode 400a of the type shown in FIG. 3 including a p-metallisation layer 402 covering an active region 403. The width of the p-metallisation layer 402 is broader than that of the active region 403. The p-metallisation layer 402 near a back end 412 of the laser diode 400a includes wire bonds 413 through which current can be injected into the metallisation layer 402 and thus into the active region 403. There are no wire bonds on a region of the metallisation layer 402 near a front end 411 of the laser diode 400a. The p-metallisation layer 402 is profiled such that the width of this layer near the front end 411 is reduced compared to that near the back end 412. However, the reduced width of the p-metallisation layer 402 near the front end 411 is also larger than that of the active region 403. As the shape of the p-metallisation layer 402 near the front end 411 is modified (by reducing the width of the p-metallisation layer) compared to that near the back end 412, there is an increase in resistance along a current path near the front end 411 and thus, a decrease in current injection in the active region 403 near the front end 411.

Figure 4B:
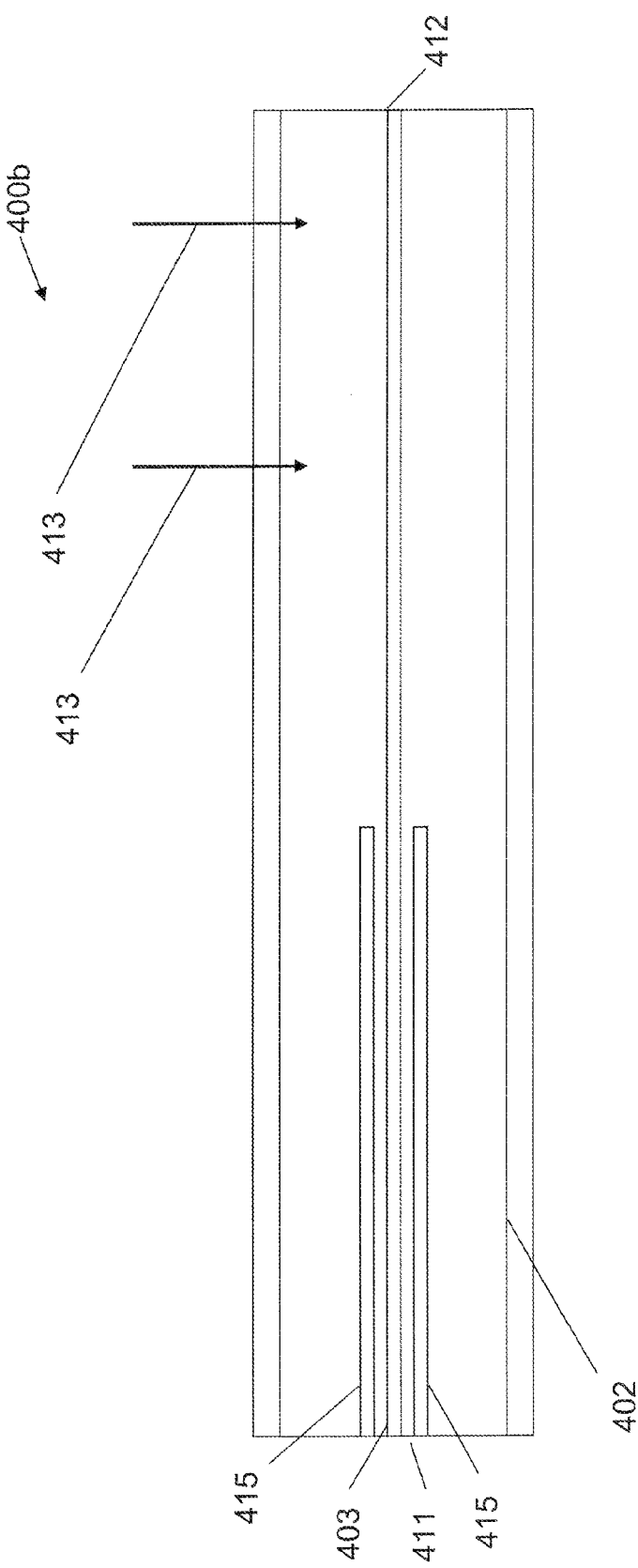

FIG. 4b is a schematic plan view of an alternative laser diode 400b. Many features of the laser diode of FIG. 4b are similar to those of laser diode of FIG. 4a, carrying the same reference numerals, i.e. a p-metallisation layer 402, an active region 403, front and back ends 411, 412 of the diode and wire bonds 413 on the metallisation layer 402 towards the back end 412 of the diode. However, towards the front end 411, the p-metallisation layer 402 includes insulating gaps 415. As a result, the effective width of the p-metallisation layer 402 towards the front end 411 is reduced compared to that of the back end. This results in an increase in resistance along the current path towards the front end 411. The width of the p-metallisation layer 402 towards the front end 411 is again larger than that of the active region 403. It will be appreciated that the laser diode of FIG. 4*b* is electrically equivalent to that of FIG. 4*a*.

Figure 4C:
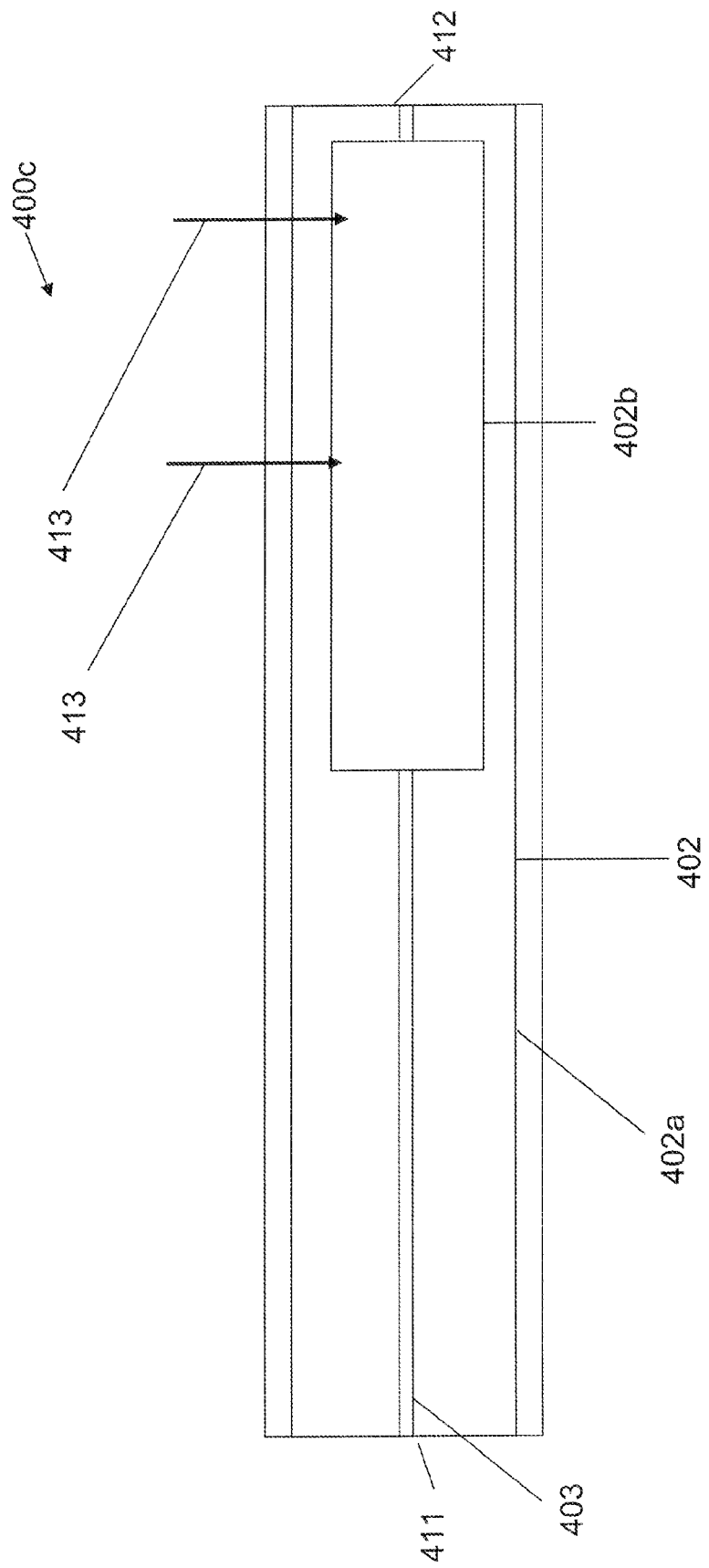

FIG. 4*c* is a schematic plan view of an alternative laser diode 400*c*. The laser diode of FIG. 4*c* has similar features to those of the laser diodes of FIGS. 4*a* and 4*b*, i.e. a p-metallisation layer 402, an active region 403, front and back ends 411, 412 of the laser diode and wire bonds 413 on the metallisation layer 402 towards the back end 412. However, in this embodiment, the thickness of the p-metallisation layer 402 is modified by independently depositing two layers 402*a*, 402*b* deposited on top of each other. The p-metallisation layer 402 includes a thick metal layer 402*b* and a thin metal layer 402*a* patterned such that the thick metal layer 402*b* covers a part of the thin metal layer 402*a* towards the back end 412. The thickness of the p-metallisation layer is relatively less towards the front end 411, which results in an increase in resistance along a current path towards the front end 411 of the laser diode.

Figure 4D:
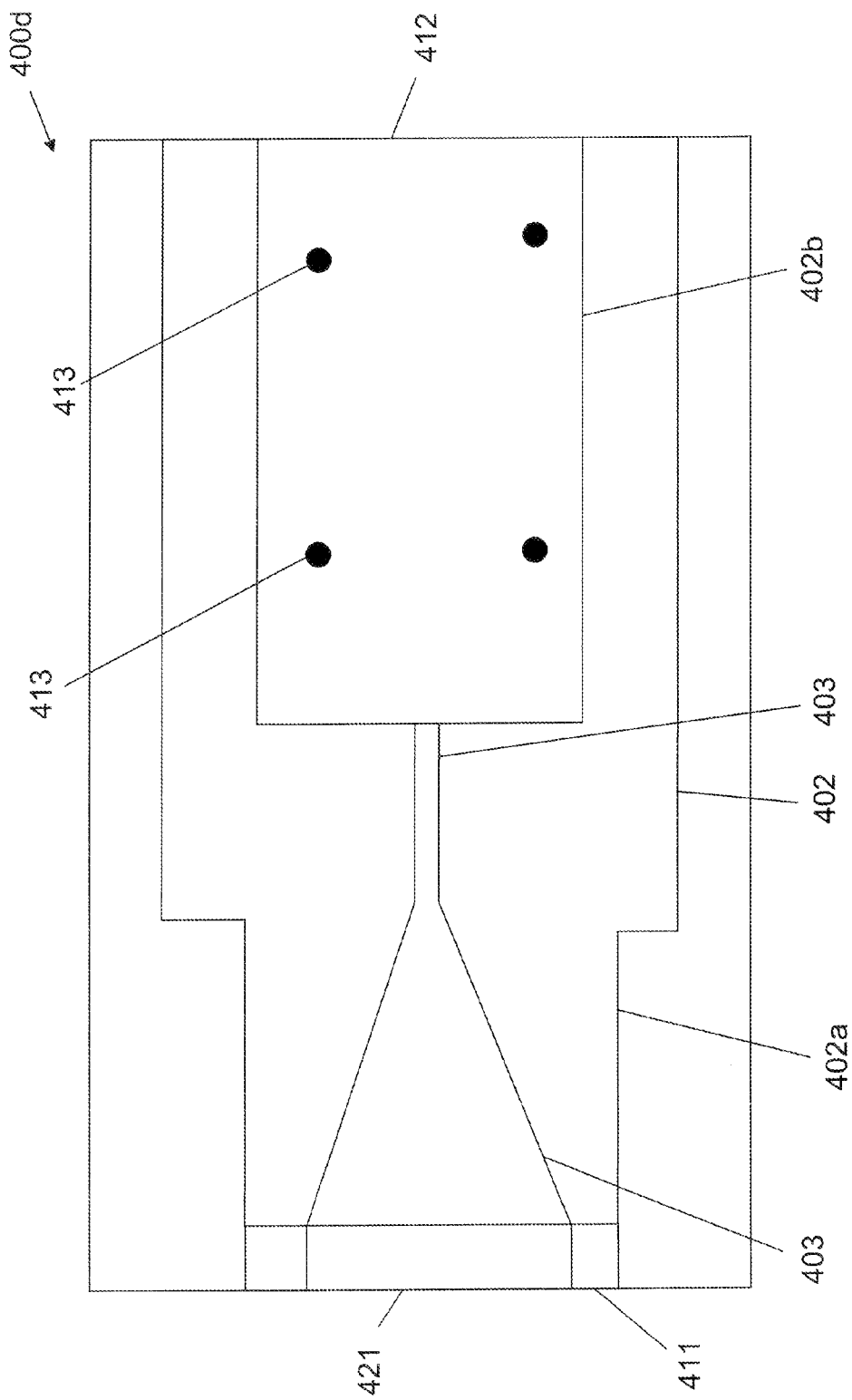

FIG. 4*d* is a schematic plan view of an alternative laser diode 400*d*. Many features of FIG. 4*d* are similar to those of FIG. 4*c*, i.e. a p-metallisation layer 402 including a thin layer 402*a* and a thick layer 402*b* on top of the thin layer 402*a*, an active region 403, front and back ends 411, 412 of the laser diode and wire bonds 413 on the metallisation layer 402 towards the back end 412. However, the active region 403 has a flared structure (having a relatively large width) towards the front end 411. The width of the thin metallisation layer 402*b* towards the front end 411 is reduced compared to that towards the back end 412. However, the width of the thin metallisation layer 402*a* towards the front end 411 is still larger than that of the flared structure of the active region 403. The metallisation layer 402*a* towards the front end 411 does not include any wire bonds for current injection in the active region 403. At the front end 411 of the diode, there may be an optional insulating layer 421 between the thin metallisation layer 402*a* and the semiconductor cladding layer (not shown). This insulating layer 421 blocks current injection in the active region 403 so that an unpumped end section (UES) is formed at the front end 411 of the diode. The current injection is constant towards the back end 412 but is controlled near the unpumped end section at the front end 411 by reducing the thickness of the metallisation layer (by the use of the thin metallisation layer 402*b*) and by reducing the width of the metallisation layer. As a result, there is an increase in resistance along a current path towards the front end 411 of the laser diode and thus, a decrease in current injection towards the front end 411 where the insulating layer 421 is provided for blocking the current injection completely.

It will be appreciated that the p-metallisation layer of the laser diode described with reference to FIGS. 4*a* to 4*d* can be patterned or profiled by combining the designs shown in FIGS. 4*a* to 4*d*. It will be also appreciated that the insulating layer 421 forming the unpumped end section of FIG. 4*d* may also be provided at the front end 411 of any of the arrangements of FIGS. 4*a* to 4*c*.

Figure 5A:
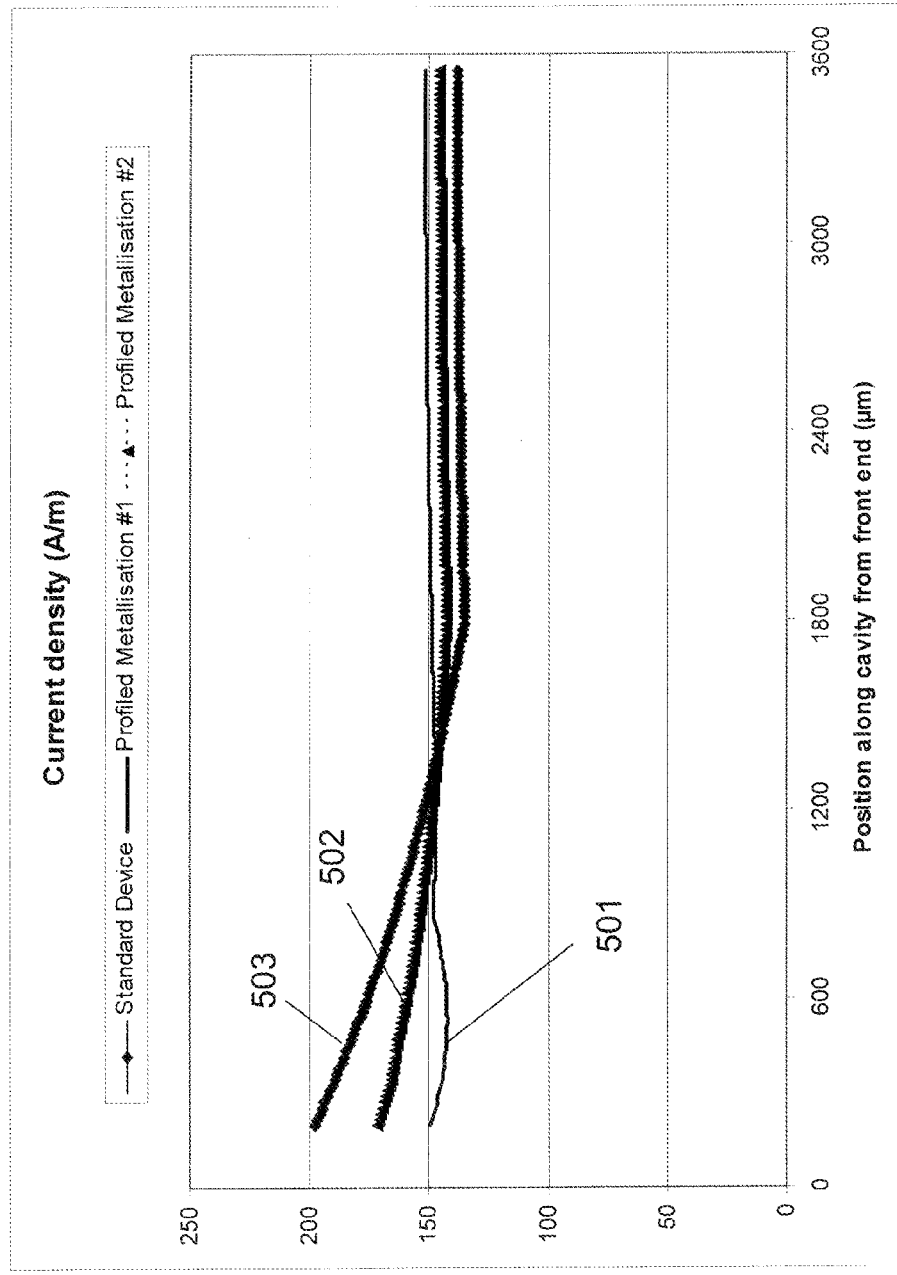
FIG. 5a shows a comparative simulation of the current density distribution along the longitudinal axis of laser diodes of the present invention and standard laser diodes.

FIG. 5*a* shows comparative simulation results of the current density between the laser diodes with the p-metallisation layer patterned and/profiled (by reducing the thickness and/or width) and standard laser diodes. Two different current distributions achieved by different dimensions of profiled metallisation demonstrate the design flexibility, e.g. by reducing the width and thickness of the metallisation layer. As can be seen, the current density of the laser diodes having profiled and/or patterned metallisation layers (shown by curves 501, 502) is more uniform (throughout the longitudinal axis) compared to that of standard devices (shown by curve 503). It will be appreciated that further improvements in current uniformity may be achieved by appropriate shaping of the p-metallisation layer.

Figure 5B:
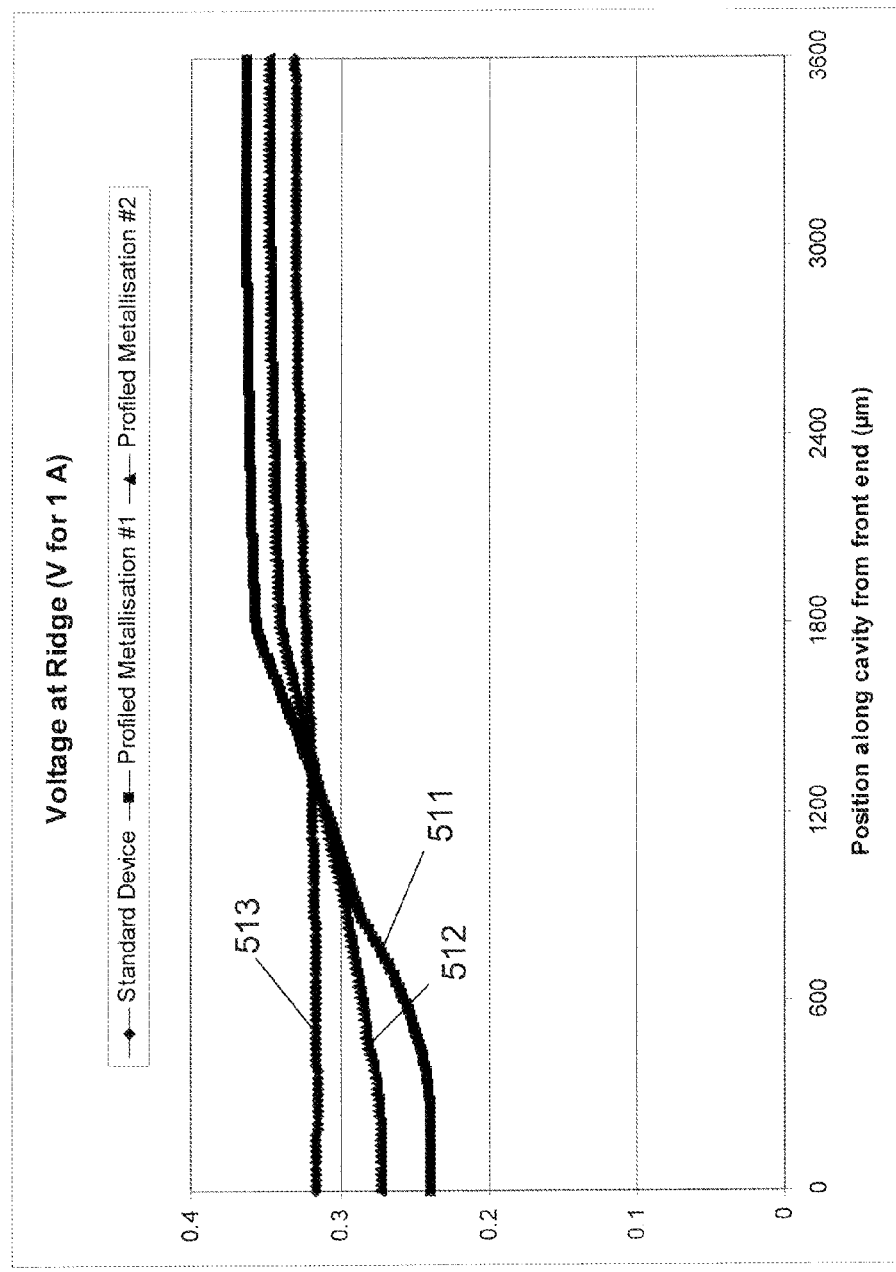
FIG. 5b shows a comparative simulation of the electrical potential along the longitudinal axis of laser diodes of the present invention and standard laser diodes.

FIG. 5*b* shows simulation results of the voltage distribution 511, 512, 513 for the laser diodes shown in FIG. 5*a*. The higher resistance along the current path to the front end results in a lower residual voltage near the front end (X axis<1800 μm) and thus the more uniform current distribution shown in FIG. 5*a*.

The p-metallisation layer of the devices described with reference to FIGS. 4*a* to 4*d* can be routinely patterned by well-known techniques such as selective deposition or selective removal after deposition (etching). One possible way of patterning the p-metallisation layer is to modify the shape of the masks used for these deposition or removal techniques, without the need to introduce additional patterning steps.

It will be appreciated that one possible outcome of the design is to make the current density uniform but there may be circumstances where a more specific profile would be advantageous. For example, it may be necessary to maximise power or to further enhance reliability by compromising power. In this case, the flexibility of the patterning of the p-metallisation layer adjusts both optical and current density profiles quasi-independently.

Further advantages may be achieved, in many applications, by bonding the p-region of the semiconductor body to a metallised submount by soldering. However, in such a circumstance, the current profiling features would be shorted out. In order to overcome this, a dielectric layer and a second level of metallisation could be provided.

It will be appreciated that the features of the laser diode described with reference to FIGS. 4*a* to 4*d* are compatible with all other features used in high power pump devices, such as the unpumped end sections and E2 facet coating.

It will be noted that the foregoing description is directed to arrangements having a p-metallisation layer for which the width and/or thickness is reduced in discrete steps towards the front end, giving rise to distinct "front" and "back" regions. However, it will be appreciated that the p-metallisation layer may also vary in width more continuously, i.e. without being separated into discrete regions.

It will be further appreciated that an additional method that can in principle be used to control longitudinal current profile is to restrict the metallisation width on top of the laser ridge by extending an underlying dielectric layer laterally to partially cover the ridge. The present inventors have recognised the fact that, in practice, this has disadvantages in terms of dielectric stress and control. The resistance and lateral current spreading effects are non-linear and very dependent on local material properties. In addition, increased stress will be apparent from the dielectric material, giving additional reliability hazard.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A semiconductor laser diode comprising:
a semiconductor body having a n-region and a p-region laterally spaced apart within the semiconductor body;
an active region between the n-region and the p-region having a front end and a back end;
a first metallisation layer adjacent the n-region and having a first injector disposed thereon for injecting current into the active region; and
a second metallisation layer opposite the first metallisation layer and adjacent the p-region and having a second injector disposed thereon for injecting current into the active region;
wherein the thickness and/or width of at least one metallisation layer is chosen so as to control the current injection in a part of the active region near at least one end of the active region compared to the current injection in another part of the active region, and the width of the at least one metallisation layer is larger than the width of the active region; and
wherein the active region comprises a flared portion near the front end, which is covered by a section of the at least one metallisation layer having reduced width and/or thickness.

2. The laser diode of claim 1, wherein the at least one metallisation layer comprises a front end section near the front end of the active region, and the front end section is configured such that the current injection near the front end of the active region is substantially reduced compared to that elsewhere of the active region.

3. The laser diode of claim 2, wherein the width and/or the thickness of the front end section of the at least one metallisation layer is less than that elsewhere in the at least one metallisation layer.

4. The laser diode of claim 2, wherein the front end section of the at least one metallisation layer is configured such that the resistance of the at least one metallisation layer is increased in the front end section compared to elsewhere in the at least one metallisation layer.

5. The laser diode of claim 1, wherein the at least one metallization layer is configured such that the current injection near the front and back ends of the active region is reduced compared to that in a middle section of the active region.

6. The laser diode of claim 1, wherein the at least one metallisation layer is configured to provide a substantially uniform current density near the front end of the active region.

7. The laser diode of claim 1, wherein the injector comprises a wire bond placed on a section of the at least one metallization layer distant from the at least one end of the active region.

8. The laser diode of claim 1, further comprising an insulating layer at the front end of the active region between at least one metallization layer and the semiconductor body for blocking current injection at the front end of the active region, the insulating layer forming an unpumped end section in the active region.

9. The laser diode of claim 1, wherein the at least one metallisation layer comprises a first layer and a second layer, the second layer being thicker than the first layer.

10. The laser diode of claim 9, wherein the second layer covers at least part of the first layer over a back end section of the at least one metallization layer.

11. The laser diode of claim 1, which is selected from the group comprising:
a flared ridge diode;
a non-flared ridge diode, and
a broad area single emitter (BASE) diode.

12. The laser diode of claim 1, wherein the p-region of the semiconductor body is configured to be bonded to a metallised submount.

13. A method of manufacturing a high power laser diode comprising
a semiconductor body having a n-region and a p-region laterally spaced apart within the semiconductor body;
an active region between the n-region and the p-region having a front end and a back end;
a first metallisation layer adjacent the n-region and having a first injector disposed thereon for injecting current into the active region; and
a second metallisation layer opposite the first metallisation layer and adjacent the p-region and having a second injector disposed thereon for injecting current into the active region;
the method comprising varying the width and/or thickness of at least one metallisation layer along the length of the diode so as to control the current injection in a part of the active region near at least one end of the active region compared to the current injection in another part of the active region, the width of the at least one metallisation layer being greater than the width of the active region along the length of the diode; and
forming a flared portion near the front end of the active region, which is covered by a section of the at least one metallisation layer having reduced width and/or thickness.

14. The method of claim 13, comprising manufacturing the at least one metallisation layer by a patterning process selected from the group comprising selective deposition and selective removal after deposition or etching.

15. The method of claim 14, further comprising choosing a shape of a mask used for the patterning process so as to achieve a predetermined pattern of the metallisation layer.

16. The method of claim 13, wherein the current injection at the front end is reduced by one or all of:
reducing width and/or thickness of a front end section of the at least one metallisation layer compared to a back end section;
positioning at least one injector comprising a wire bond on the back end section of the at least one metallization layer;
profiling submount or optimising material of the p-region and/or n-region, and
forming an insulating layer at the front end of the active region between the at least one metallisation layer and the semiconductor body.

* * * * *